(12) United States Patent
Fukui

(10) Patent No.: US 6,696,735 B2
(45) Date of Patent: Feb. 24, 2004

(54) SEMICONDUCTOR DEVICE AND METHOD FOR FABRICATING THE SAME

(75) Inventor: Hironobu Fukui, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/083,561

(22) Filed: Feb. 27, 2002

(65) Prior Publication Data

US 2003/0116811 A1 Jun. 26, 2003

(30) Foreign Application Priority Data

Dec. 21, 2001 (JP) ........................................ 2001-390038

(51) Int. Cl.[7] ............................................. H01L 27/092
(52) U.S. Cl. ........................ 257/410; 257/351; 257/369; 257/392
(58) Field of Search ................................. 257/410, 411, 257/351, 402, 405, 392, 369

(56) References Cited

U.S. PATENT DOCUMENTS 6,093,661 A * 7/2000 Trivedi et al. ............... 438/769
6,417,037 B1 * 7/2002 Feng ........................... 438/216

FOREIGN PATENT DOCUMENTS

| JP | 3-259564 | 11/1991 |
| JP | 10-4145 | 1/1998 |
| JP | 2000-269355 | 9/2000 |

* cited by examiner

Primary Examiner—Jerome Jackson
Assistant Examiner—Matthew C. Landau
(74) Attorney, Agent, or Firm—Oblon, Spivak, McClelland, Maier & Neustadt, P.C.

(57) ABSTRACT

A semiconductor device according to one aspect of the present invention, is a semiconductor device comprising: a first MOS field effect transistor of an n-type including a first oxynitride film as a first gate insulator film; and a second MOS field effect transistor of a p-type including a second oxynitride film as a second gate insulator film, the second MOS field effect transistor being disposed adjacent to the first MOS field effect transistor; wherein a concentration of nitrogen in the first gate insulator film is different form that in the second gate insulator film.

5 Claims, 11 Drawing Sheets

SEMICONDUCTOR DEVICE AND METHOD FOR FABRICATING THE SAME

CROSS REFERENCE TO RELATED APPLICATION

This application is based upon and claims the benefit of priority from the prior Japanese Patent Application No.2001-390038 filed on Dec. 21, 2001; the entire contents of which are incorporated herein by reference.

BACKGROUND OF THE INVENTION

1. Field of the Invention

The present invention relates generally to a semiconductor device and a method for fabricating the same. More specifically, the invention relates to a CMOS field effect transistor using an oxynitride film as a gate insulator film, and a method for fabricating the same.

2. Related Background Art

Semiconductor devices use various active elements for constituting integrated circuits. One of most typical active elements is a MOS field effect transistor (MOSFET). The MOSFET is a semiconductor device wherein the conduction and non-conduction states between a source and a drain are controlled by a voltage applied to a gate electrode which is formed on a semiconductor substrate via an insulator film. As a typical application of the MOSFET, there is a CMOS-FET wherein an n-channel MOSFET and a p-channel MOSFET are provided to complimentarily function.

By the way, the thickness of gage oxide films is decreasing with the scale down of transistors. If the thickness of a gate oxide film is 2 nm or less, the increase of electric power consumption during stand-by due to tunnel current, and the increase of dispersion in threshold due to penetration of boron (B) cause problems. The former causes serious problems in n-channel MOSFETs, and the latter causes serious problems in p-channel MOSFETs. In order to solve these problems, there are some cases where an oxynitride film is used as a gate insulator film.

Oxynitride films can have a higher dielectric constant than that of an oxide film, and can have a larger physical thickness than that of an oxide film having the same capacity, so that it is possible to reduce the tunnel current. Since the dielectric constant of the oxynitride film increases as the concentration of nitrogen increases, the tunnel current can be reduced with the increase of the concentration of nitrogen. However, there is a problem in that the current driving force of a transistor deteriorates with the increase of the concentration of nitrogen. Particularly in n-channel MOSFETs, this problem is conspicuous. Therefore, with respect to n-channel MOSFETs, it can be said that the upper limit of the concentration of nitrogen in the gate oxynitride film is determined by an allowable gate tunnel current.

On the other hand, oxynitride films can more greatly suppress the dispersion of boron and the deterioration of characteristics due to penetration of boron than those in oxide films. As the concentration of nitride increases, the boron penetration suppressing effect increases, so that it is possible to reduce the dispersion in threshold. Therefore, with respect to p-channel MOSFETs, it can be said that the lower limit of the concentration of nitrogen in gate oxynitride films is determined by an allowable dispersion in threshold.

As described above, in p-channel MOSFETs, it is required to provide an oxynitride film having a higher concentration of nitrogen in order to prevent penetration of boron. On the other hand, in n-channel MOSFETs, it is required to suppress the concentration of nitrogen in the oxynitride film in order to prevent the deterioration of the current driving force while reducing the tunnel current.

By the way, in semiconductor integrated circuits, the quantity of allowable tunnel current varies with uses, whereas the quantity of allowable penetrating boron, i.e., the allowable dispersion in threshold, is constant independent of uses. Therefore, the upper limit of the concentration of nitrogen in the gate oxynitride film of an n-channel MOSFET may lower than the lower limit of the concentration of nitrogen in the gate oxynitride film of a p-channel MOSFET.

In a conventional process for fabricating an LSI, the gate insulator films of n-channel and p-channel MOSFETs are simultaneously formed, so that both of the gate insulator films must use oxynitride films having the same concentration of nitrogen.

As a result, it is difficult to simultaneously prevent deterioration of the current driving force in the n-channel MOSFET and penetration of boron in the p-channel MOSFET.

SUMMARY OF THE INVENTION

According to one embodiment of a semiconductor device according to the present invention, there is provided with a semiconductor device comprising:
a first MOS field effect transistor of an n-type including a first oxynitride film as a first gate insulator film; and
a second MOS field effect transistor of a p-type including a second oxynitride film as a second gate insulator film, the second MOS field effect transistor being disposed adjacent to the first MOS field effect transistor;
wherein a concentration of nitrogen in the first gate insulator film is different form that in the second gate insulator film.

According to one embodiment of a semiconductor device according to the present invention, there is provided with a semiconductor device comprising:
a first MOS field effect transistor of an n-type including a first oxynitride film as a first gate insulator film; and
a second MOS field effect transistor of a p-type including a second oxynitride film as a second gate insulator film, the second MOS field effect transistor being disposed adjacent to the first MOS field effect transistor;
wherein a difference in thicknesses between the first and second gate insulator films is in proportion to a difference between concentrations of nitrogen in the first and second gate insulator films as a result of introduction of different concentrations of nitrogen into oxide films having had the same thickness.

According to one embodiment of a semiconductor device according to the present invention, there is provided with a semiconductor device comprising:
a first MOS field effect transistor of an n-type including a first oxynitride film as a first gate insulator film; and
a second MOS field effect transistor of a p-type including a second oxynitride film as a second gate insulator film, the second MOS field effect transistor being disposed adjacent to the first MOS field effect transistor;
wherein the first and second gate insulator films have different concentrations of nitrogen and different thickness values as a result of introduction of nitrogen at the same surface density into oxide films having had different thickness values.

According to one embodiment of a method for fabricating a semiconductor device according to the present invention, there is provided with a method comprising:

oxidizing a surface of a semiconductor substrate in first and second MOS field effect transistor regions, which are isolated from each other by an element isolating insulator film of the surface portion of the semiconductor substrate, to form a first oxide film;

introducing nitrogen into the first oxide film to form a first oxynitride film having a first concentration of nitrogen;

depositing a first polycrystalline silicon film on a surface of the first oxynitride film;

forming a first mask on the first polycrystalline silicon film in one of the first and second MOS field effect transistor regions;

removing the first polycrystalline silicon film in the other region of the first and second MOS field effect transistor regions by using the first mask;

removing the first mask to use the first polycrystalline silicon film as a mask, which remains in the one of the first and second MOS field effect transistor regions, to remove the first oxynitride film in the other region of the first and second MOS field effect transistor regions;

oxidizing the surface of the semiconductor substrate in the other region of the first and second MOS field effect transistor regions and a surface of the first polycrystalline silicon film remaining in the one of the first and second MOS field effect transistor regions to form a second oxide film on the surface of the semiconductor substrate in the other region of the first and second MOS field effect transistor regions and the surface of the first polycrystalline silicon film remaining in the one of the first and second MOS field effect transistor regions; and introducing nitrogen into the second oxide film to form a second oxynitride film having a second concentration of nitrogen.

According to one embodiment of a method for fabricating a semiconductor device according to the present invention, there is provided with a method comprising:

oxidizing a surface of a semiconductor substrate in first and second MOS field effect transistor regions, which are isolated from each other by an element isolating insulator film of the surface portion of the semiconductor substrate, to form a first oxide film having a first thickness;

forming a first mask on the first oxide film in one of the first and second MOS field effect transistor regions;

removing the first oxide film in the other region of the first and second MOS field effect transistor regions by using the first mask;

removing the first mask to oxidize the surface of the semiconductor substrate in the other region of the first and second MOS field effect transistor regions to form a second oxide film having a second thickness, which is smaller than the first thickness, on the surface of the semiconductor substrate in the other region of the first and second MOS field effect transistor regions; and introducing nitrogen into the first and second oxide films to form first and second oxynitride films.

DESCRIPTION OF THE PREFERRED EMBODIMENTS

Referring now to the accompanying drawings, the embodiments of a semiconductor device according to the present invention, and methods for fabricating the same will be described below.

Figure 1:
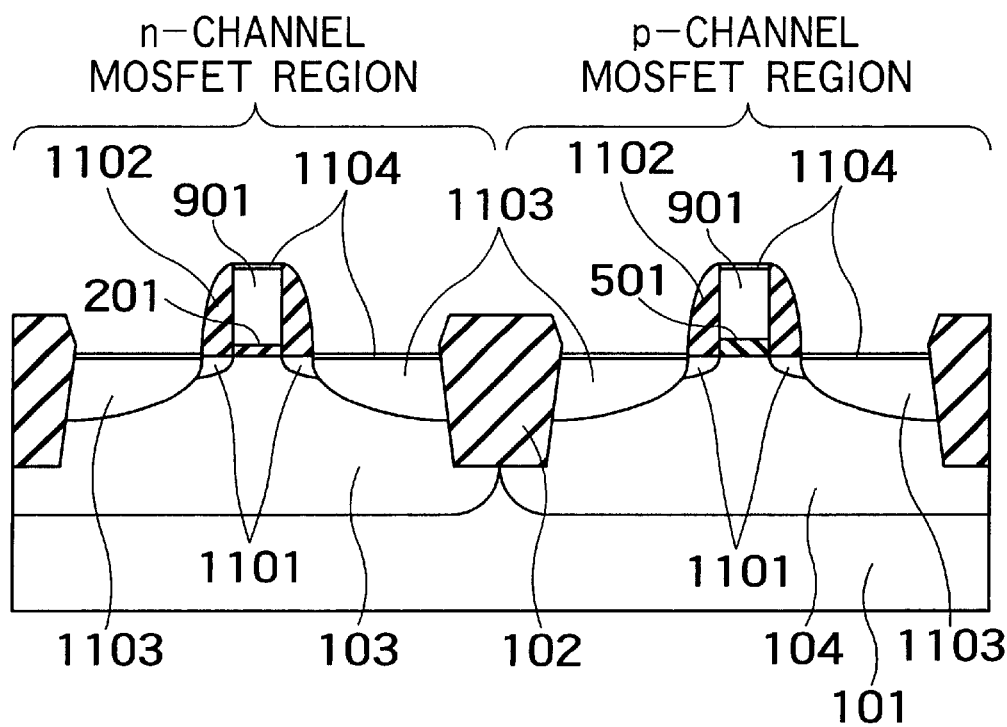
FIG. 1 is a sectional view of the first embodiment of a semiconductor device according to the present invention.

FIG. 1 is a sectional view showing the first embodiment of a semiconductor device according to the present invention.

A semiconductor substrate 101 is separated into an n-channel MOSFET region and a p-channel MOSFET region by an element isolating insulator film 102 which is formed by the STI (Shallow Trench Isolation) method. In these regions, an n-well 103 and a p-well 104 are formed, respectively.

In the n-channel MOSFET region, in the central portion on the surface of the substrate 101, a gate insulator film 201 is formed. On the gate insulator film 201, a gate electrode 901 is formed. On both sides of the gate insulator film 201 and the gate electrode 901, in the vicinity of the surface of the substrate 101, first diffusion layers 1101 are formed so as to be self-aligned with the gate insulator film 201 and the gate electrode 901. On both sides of the gate insulator film 201 and the gate electrode 901, in portions on the top of the first diffusion layer 1101, side walls 1102 are formed. Outside of the first diffusion layers 1101 on both sides, second diffusion layers 1103 are formed, respectively. On the top face of the gate electrode 901 and the surface of the second diffusion layers 1103, silicide films 1104, e.g., cobalt silicide films 1104, are formed, respectively.

The structure of the p-channel MOSFET region is substantially the same as that of the n-channel MOSFET region. However, the gate insulator film 501 of the p-channel MOSFET and the gate insulator film 201 of the n-channel MOSFET are oxynitride films having different thickness and different concentration of nitrogen. By introducing different concentrations of nitrogen into oxide films having the same thickness, the thickness increases in proportion to the respective concentrations of nitrogen, so that the difference in thickness between gate insulator films 201 and 501 is in proportion to the difference between the concentrations of nitrogen. This point is a feature of the first embodiment of a semiconductor device according to the present invention.

Figure 2:
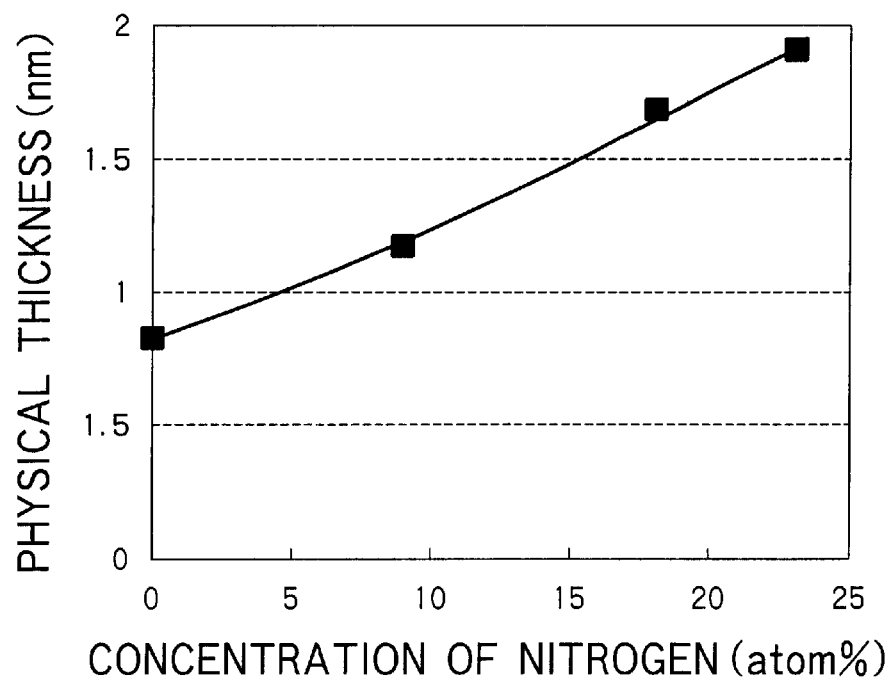
FIG. 2 is a graph showing the relationship between the thickness of a gate insulator film of a MOSFET and the concentration of nitrogen therein.

FIG. 2 is a graph showing the relationship between the thickness of the gate insulator film of a MOSFET and the concentration of nitrogen therein.

As can be seen from FIG. 2, it can be said that the relationship between the physical thickness (nm) of an oxynitride film, which is used as a gate insulator film, and the concentration of nitrogen (atom %) therein is substantially a proportional relationship. In an example of FIG. 2, assuming that the thickness values of the gate insulator films of the n-channel MOSFET and p-channel MOSFET are 1.2 nm and 1.7 nm, respectively, the concentrations of nitrogen are 9 atom % and 18 atom %, respectively. It is herein assumed that the thickness of an oxide film before introduction of nitrogen (which will be hereinafter referred to as a "base oxide film") is 0.8 nm. Although the thickness of the oxynitride film with respect to the concentration of nitrogen varies in accordance with the thickness of the base oxide film which will form the basis therefor, the proportional coefficient between the thickness and the concentration of nitrogen, i.e., the gradient of the graph, is usually substantially the same as that in the graph of FIG. 2.

The first embodiment of a semiconductor device according to the present invention can solve problems which are conventionally difficult to be solved, as a result that the gate insulator films of the n-channel and p-channel MOSFETs have the difference in thickness which is in proportion to the difference in concentration of nitrogen. That is, it is possible to sufficiently prevent penetration of boron in the p-channel MOSFET, and it is also possible to obtain a sufficient current driving force while reducing the tunnel current in the n-channel MOSFET.

A method for fabricating the first embodiment of a semiconductor device according to the present invention will be described below.

FIGS. 3A through 3K are sectional views showing a sectional structure at a process of a method for fabricating the first embodiment of a semiconductor device according to the present invention, respectively.

Figure 3A:
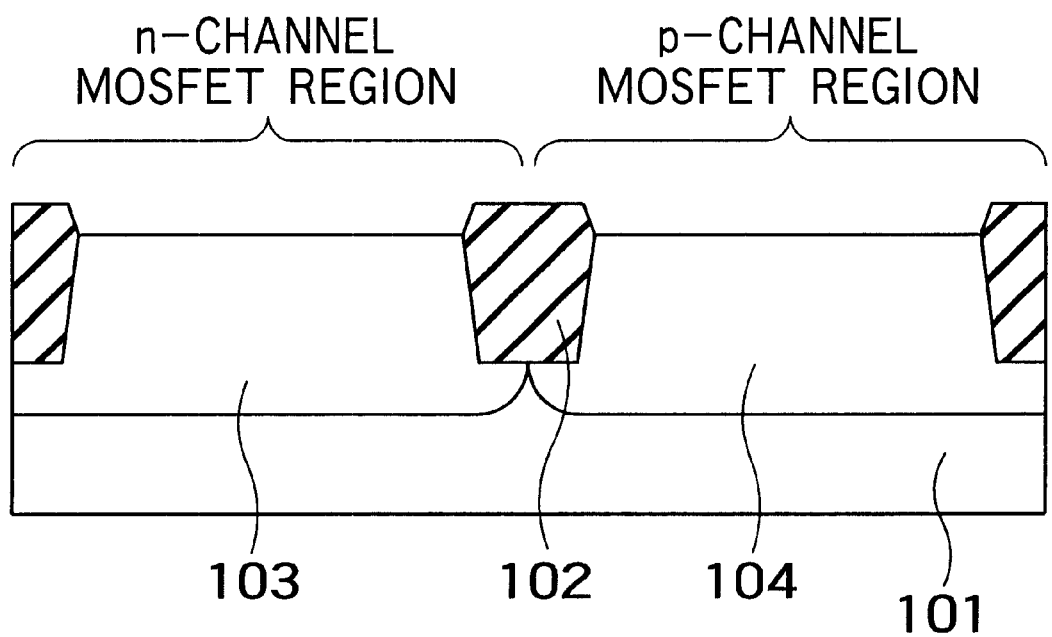
FIG. 3A is a sectional view showing an element isolating and a well forming in a method for fabricating the first embodiment of a semiconductor device according to the present invention.

First, as shown in FIG. 3A, an element isolating insulator film 102 is formed on a silicon substrate 101 by the STI method. Thereafter, an oxide film (not shown) is formed so as to cover element regions, and a resist (not shown) is formed thereon to ion-implant an n-type impurity into a p-channel MOSFET region and a p-type impurity into an n-channel MOSFET region to sequentially form an n-type well 103 and a p-type well 104. The reason why the oxide film is formed below the resist formed before ion implantation is to prevent the resist from directly contacting the surface of the silicon substrate.

Figure 3B:
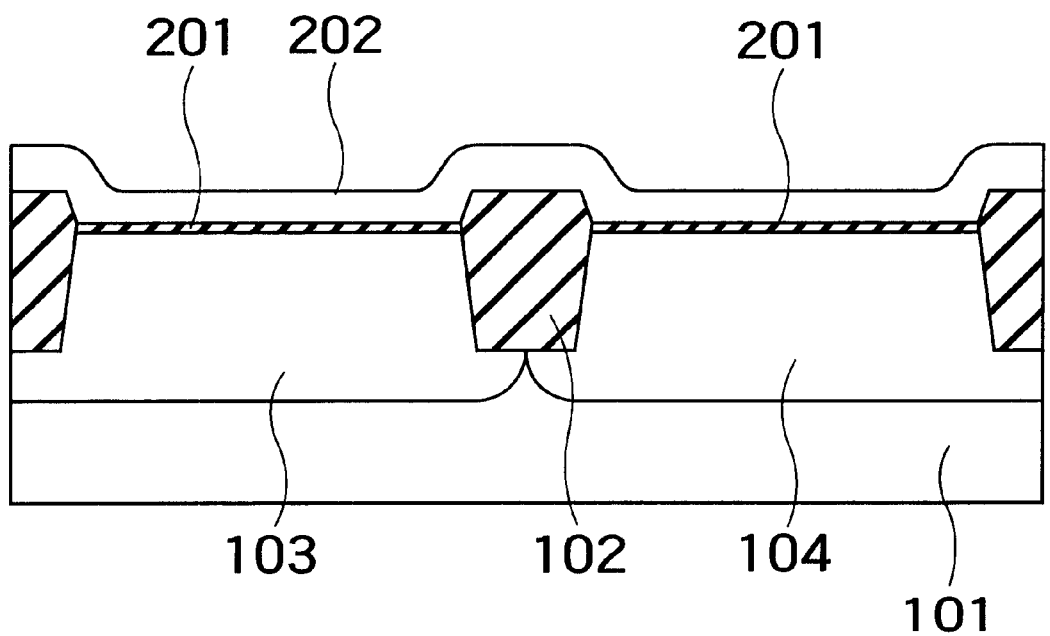
FIG. 3B is a sectional view showing a gate insulator film forming and a polycrystalline silicon film depositing for an n-channel MOSFET in a method for fabricating the first embodiment of a semiconductor device according to the present invention.

After forming the n-type well 103 and the p-type well 104, the oxide film is removed to form a gate insulator film 201 of the n-channel MOSFET as shown in FIG. 3B. An oxynitride film, which will be the gate insulator film 201, is formed as follows. First, a base oxide film is formed by the thermal oxidization method. Then, nitrogen monoxide (NO) gas and/or dinitrogen oxide ($N_2O$) gas are used for annealing the base oxide film to introduce nitrogen into the base oxide film. Alternatively, nitrogen may be introduced into the base oxide film by plasma-nitriding the base oxide film. At this time, the concentration of nitrogen in the oxynitride film, which will be the gate insulator film 201 of the n-channel MOSFET, is set to be the above described optimum concentration, e.g., 9 atom %, to form the oxynitride film 201 having a thickness according to the concentration of nitrogen. For example, if the thickness of the base oxide film is 0.8 nm, the thickness of the oxynitride film 201 is 1.2 nm.

In this embodiment, the oxynitride film, which will be the gate insulator film of the n-channel MOSFET, is previously formed. However, the oxynitride film, which will be the gate insulator film of the p-channel MOSFET, may be previously formed. Thereafter, a thin polycrystalline silicon film 202 is deposited on the gate insulator film 201.

Figure 3C:
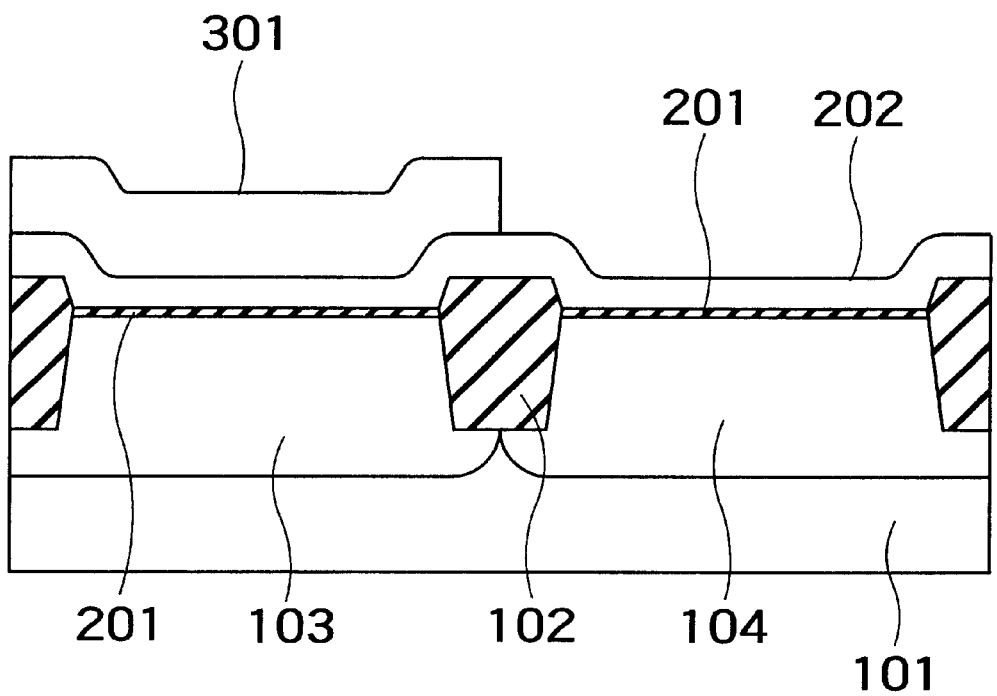
FIG. 3C is a sectional view showing a polycrystalline silicon film working lithography in a p-channel MOSFET region in a method for fabricating the first embodiment of a semiconductor device according to the present invention.
Figure 3D:
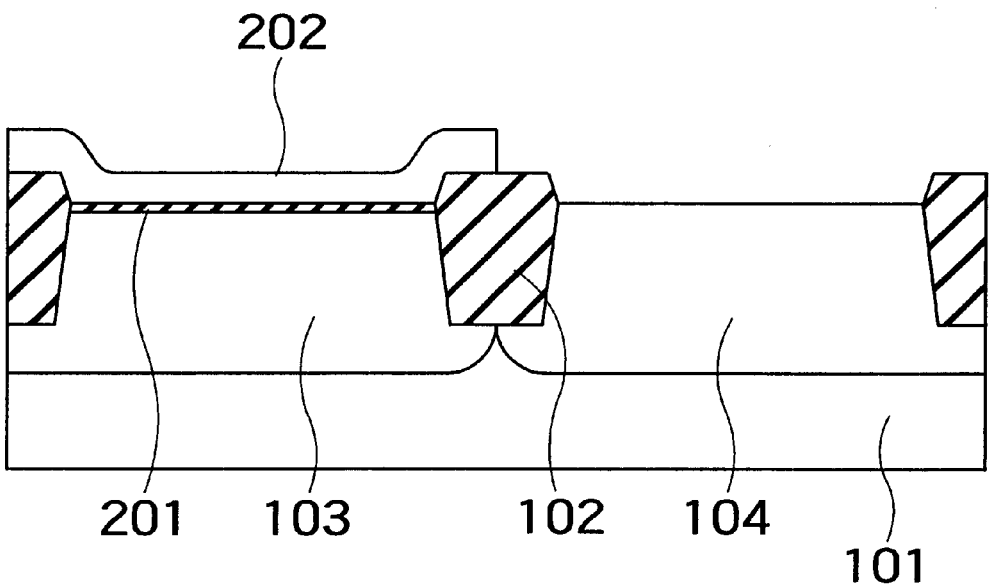
FIG. 3D is a sectional view showing an etching of a polycrystalline silicon film and an oxynitride film in a p-channel MOSFET region in a method for fabricating the first embodiment of a semiconductor device according to the present invention.

After depositing the polycrystalline silicon film 202, a photoresist film 301 is applied on the surface of the polycrystalline silicon film 202, and the photoresist film in the p-channel MOSFET region is removed by the lithography method, as shown in FIG. 3C. Then, as shown in FIG. 3D, the photoresist film 301 is used as a mask for etching the polycrystalline film 202 by the RIE. This etching is carried out until the oxynitride film 201 underlying the polycrystalline silicon film 202 is exposed. Thereafter, the photoresist film 301 is removed, and the oxynitride film 201 is removed from the surface of the p-type well 104 by the wet etching.

Figure 3E:
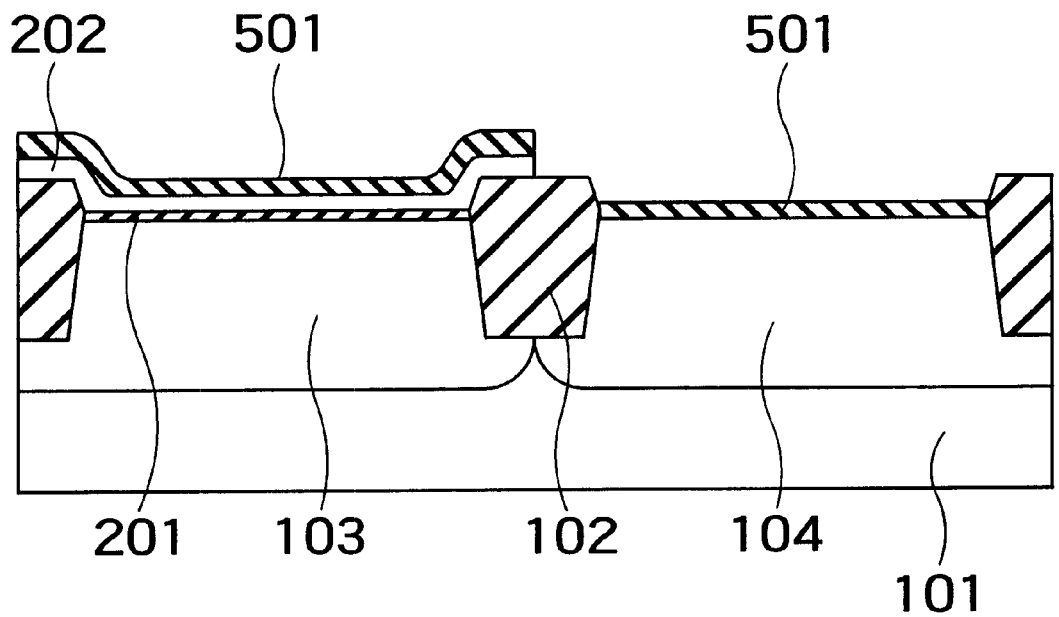
FIG. 3E is a sectional view showing a gate insulator film forming for a p-channel MOSFET in a method for fabricating the first embodiment of a semiconductor device according to the present invention.

After removing the oxynitride film 201 from the surface of the p-type well 104, an oxynitride film 501, which will be the gate insulator film of the p-channel MOSFET, is formed as shown in FIG. 3E. The forming method is the same as the method for forming the oxynitride film 201 which will be the gate insulator film of the n-channel MOSFET. When nitrogen is introduced into the base oxide film, the concentration of nitrogen in the oxynitride film, which will be the gate insulator film 501 of the p-channel MOSFET, is set to be the above described optimum concentration, e.g., 18 atom %, to form an oxynitride film having a thickness according to the concentration of nitride. For example, if the thickness of the base oxide film is 0.8 nm, the thickness of the oxynitride film 501 is 1.7 nm. The oxynitride film 501 is not only formed on the p-type well 104, but it is also formed on the polycrystalline silicon film 202 of the n-channel MOSFET region. However, the oxynitride film 501 in the n-channel MOSFET region is removed at the subsequent process. In the first embodiment, the thickness of the base oxide film, which will form the basis for the oxynitride film 501 of the p-channel MOSFET, is set to be substantially equal to the thickness of the base oxide film which will form the basis of the oxynitride film 201 of the n-channel MOSFET.

Figure 3F:
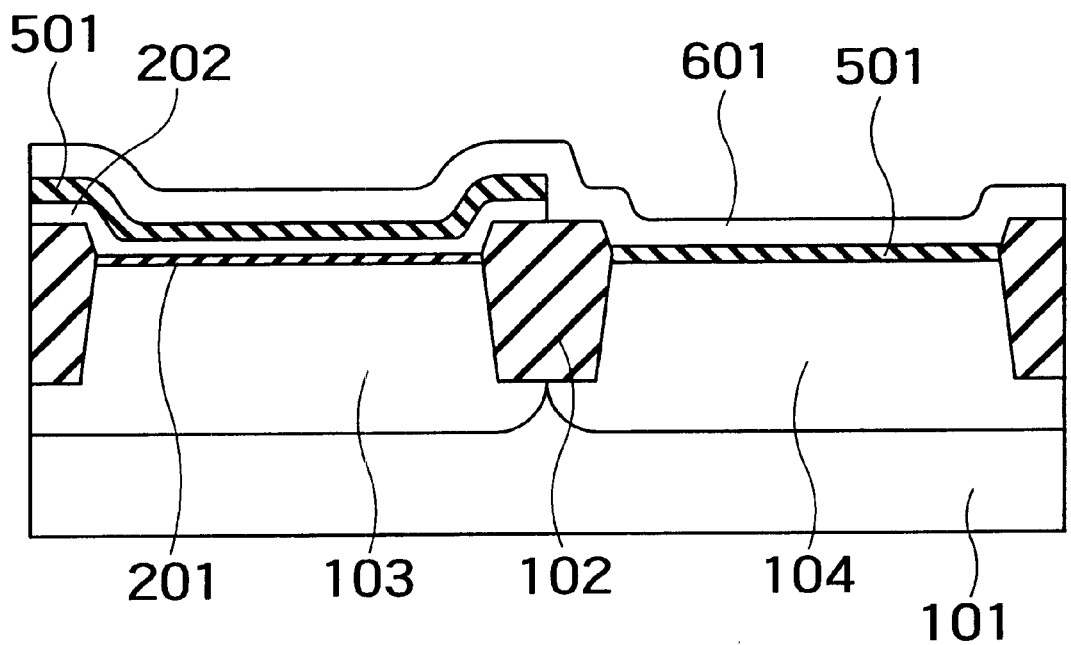
FIG. 3F is a sectional view showing a polycrystalline silicon film depositing in a method for fabricating the first embodiment of a semiconductor device according to the present invention.

After forming the oxynitride film 501, a thin polycrystalline silicon film 601 is deposited on the whole surface as shown in FIG. 3F.

Figure 3G:
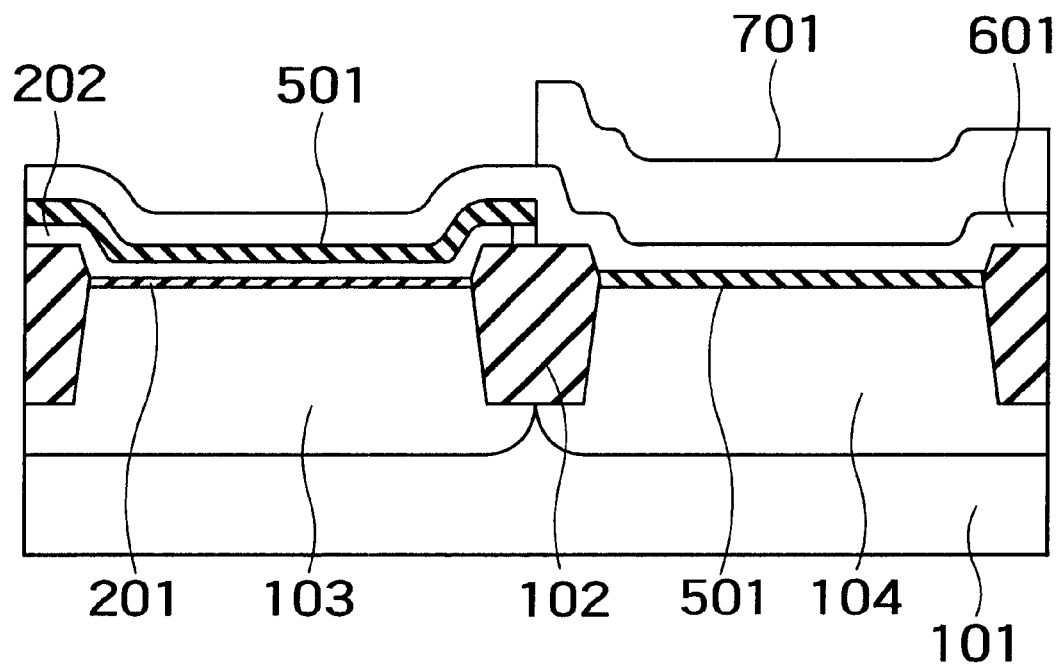
FIG. 3G is a sectional view showing a lithography for working a polycrystalline silicon film and an oxynitride film in an n-channel MOSFET region in a method for fabricating the first embodiment of a semiconductor device according to the present invention.
Figure 3H:
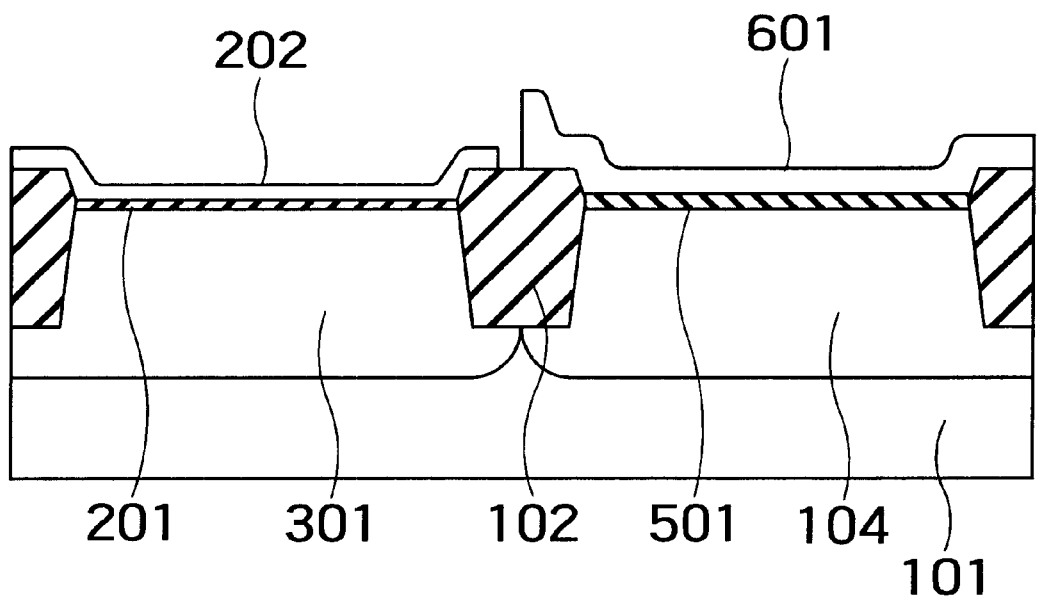
FIG. 3H is a sectional view showing an etching of a polycrystalline silicon film and an oxynitride film in an n-channel MOSFET region in a method for fabricating the first embodiment of a semiconductor device according to the present invention.

After depositing the polycrystalline silicon film 601, a photoresist film 701 is applied on the surface of the polycrystalline silicon film 601, and the photoresist film in the n-channel MOSFET region is removed by the lithography method, as shown in FIG. 3G. Then, the photoresist film 701 is used as a mask for etching the polycrystalline silicon film 601 by the RIE. This etching is carried out until the oxynitride film 501 underlying the polycrystalline silicon film 601 is exposed. Thereafter, as shown in FIG. 3H, the photoresist film 701 is removed, and the oxynitride film 501 is removed from the n-channel MOSFET region by the wet etching.

Figure 3I:
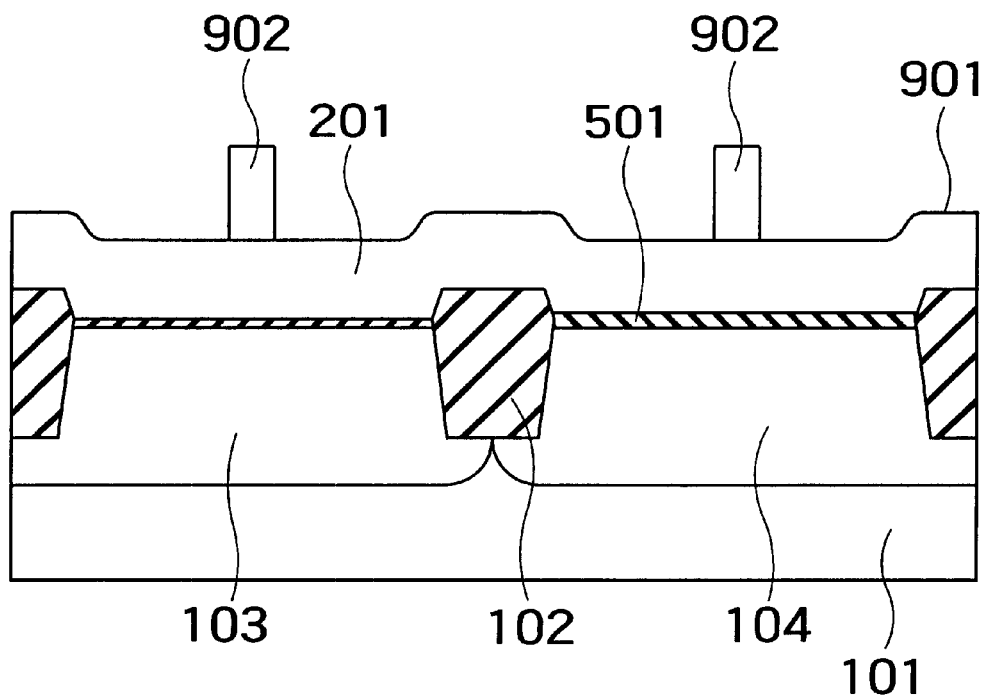
FIG. 3I is a sectional view showing a polycrystalline silicon film depositing and a gate working lithography in a method for fabricating the first embodiment of a semiconductor device according to the present invention.

After removing the oxynitride film 501 from the n-channel MOSFET region, a polycrystalline silicon film 901 is deposited on the whole surface as shown in FIG. 3I. Thereafter, a photoresist film 902 is applied on the polycrystalline silicon film 901, and the lithography method is used for patterning the photoresist film 902 to cause the photoresist film 902 to remain only in the gate portions of the n-channel MOSFET and p-channel MOSFET.

Figure 3J:
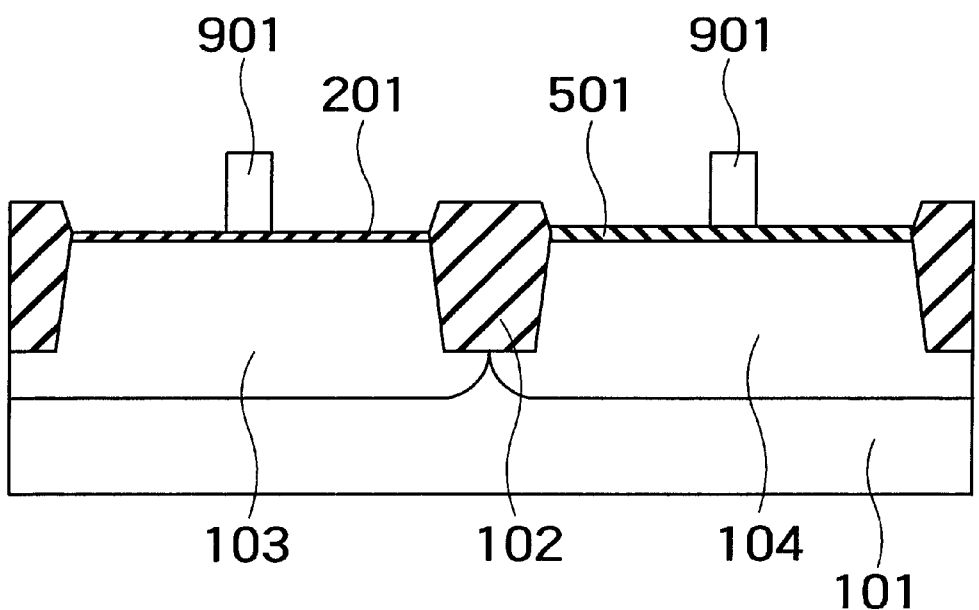
FIG. 3J is a sectional view showing a gate working in a method for fabricating the first embodiment of a semiconductor device according to the present invention.

After patterning the photoresist film 902, the photoresist film 902 is used as a mask for etching the polycrystalline silicon film 901 by the RIE to form the gates 901 of the n-channel MOSFET and p-channel MOSFET, as shown in FIG. 3J. The RIE is carried out until the oxynitride films 201 and 501 underlying the polycrystalline silicon film 901 are exposed. Thereafter, the photoresist film 902 is removed.

Figure 3K:
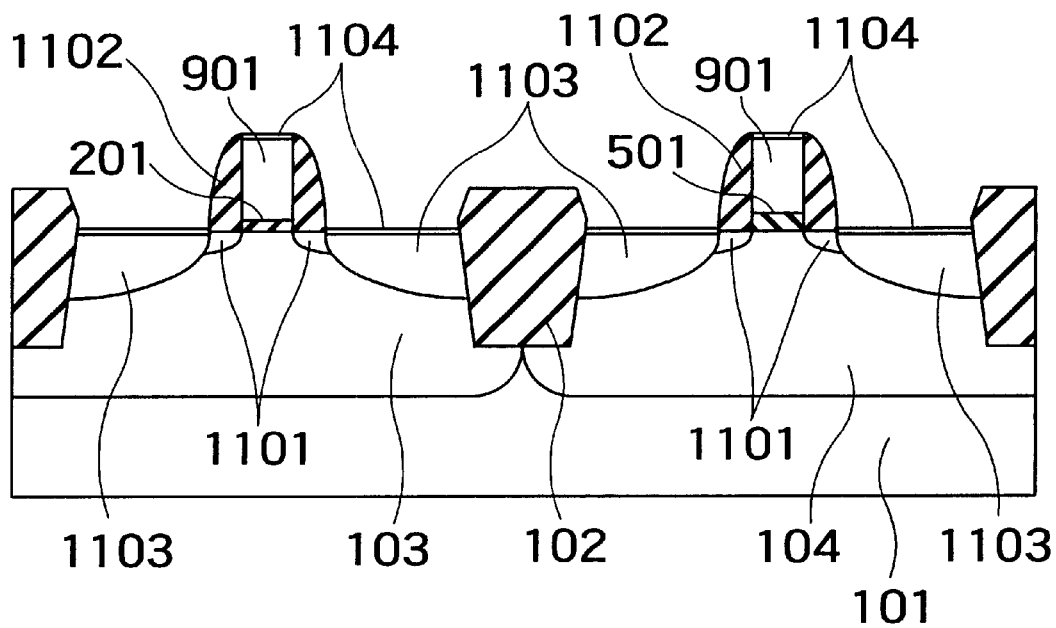
FIG. 3K is a sectional view showing a forming of a gate side wall, first and second diffusion layers, and a silicide film in a method for fabricating the first embodiment of a semiconductor device according to the present invention.

After forming the gates 901 and removing the photoresist film 902, first shallow diffusion layers 1101 are sequentially formed for the n-channel MOSFET and p-channel MOSFET by a conventional fabricating process as shown in FIG. 3K. Thereafter, a gate side wall insulator film is deposited and etched back by the RIE to form gate side walls 1102 shown in FIG. 3K. After forming the gate side walls 1102, the gates and side walls are used as masks for carrying out ion implantation and heat treatment to sequentially form second diffusion layers 1103, which are deeper than the first diffusion layers 1101, for the n-channel MOSFET and p-channel MOSFET. Thereafter, for example, a cobalt (Co) film is deposited by sputtering, and a heat treatment is carried out. As a result, cobalt silicide films 1104 are formed only on the gate electrode and source/drain diffusion layers. By the above described each process, a CMOSFET serving as the first embodiment of a semiconductor device according to the present invention shown in FIG. 1 is completed.

As described above, the CMOSFET fabricated by the method for fabricating the first embodiment of a semiconductor device according to the present invention is formed so that the gate insulator films of the n-channel and p-channel MOSFET have the optimum thickness and concentration of nitrogen at separate processes, respectively. That is, different optimum concentrations of nitrogen are introduced into oxide films having the same thickness, so that the difference in thickness between the gate insulator films of the n-channel and p-channel MOSFETs is in proportion to the difference between the concentrations of nitrogen. As a result, it is possible to sufficiently prevent penetration of boron in the p-channel MOSFET, and it is also possible to obtain a sufficient current driving force while reducing the tunnel current.

While the oxynitride films have been used for both of the gate insulator films of the n-channel and p-channel MOSFETs in the first embodiment, an oxynitride film may be used only for the gate insulator film of the p-channel MOSFET. For example, if penetration of boron in the p-channel MOSFET must be decreased although the gate leak current in the n-channel MOSFET is allowable to some extent, the oxynitride film may be used only for the gate insulator film of the p-channel MOSFET. In this case, the nitrogen introducing process after forming the base oxide film may be omitted in the process of forming the gate insulator film of the n-channel MOSFET.

While the thickness values of the base oxide films which will form the basis for the oxynitride films being the gate insulator films of the n-channel and p-channel MOSFETs have been the same in the above described first embodiment, the current driving force for the p-channel MOSFET and n-channel MOSFET can be equalized if the gate insulator film of the p-channel MOSFET is thinner than the gate insulator film of the n-channel MOSFET. That is, the gate width of the p-channel MOSFET is conventionally set to be greater than the gate width of the n-channel MOSFET to equalize the current driving force, whereas the current driving force can be equalized by adjusting the thickness of the gate insulator film according to the present invention. Therefore, it is possible to inhibit the increase of the area of the chip.

Figure 4:
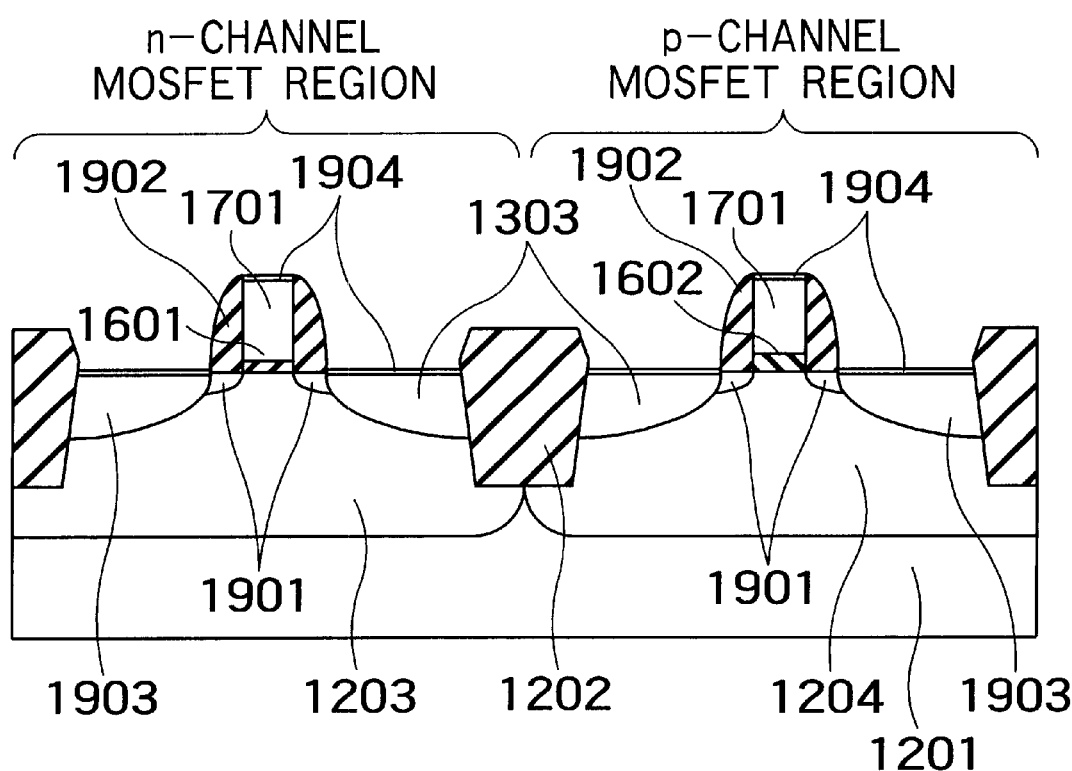
FIG. 4 is a sectional view of the second embodiment of a semiconductor device according to the present invention.

FIG. 4 is a sectional view of the second embodiment of a semiconductor device according to the present invention.

A semiconductor substrate 1201 is separated into an n-channel MOSFET region and a p-channel MOSFET region by an element isolating insulator film 1202 which is formed by the STI (Shallow Trench Isolation) method. In these regions, an n-well 1203 and a p-well 1204 are formed, respectively.

In the n-channel MOSFET region, in the central portion on the surface of the substrate 1201, a gate insulator film 1601 is formed. On the gate insulator film 1601, a gate electrode 1701 is formed. On both sides of the gate insulator film 1601 and gate electrode 1701, in the vicinity of the surface of the substrate 1201, first diffusion layers 1901 are formed so as to be self-aligned with the gate insulator film 1601 and the gate electrode 1701. On both sides of the gate insulator film 1601 and gate electrode 1701, in portions on the top of the first diffusion layer 1901, side walls 1902 are formed. Outside of the first diffusion layers 1901 on both sides, second diffusion layers 1903 are formed, respectively. On the top face of the gate electrode 1701 and the surface of the second diffusion layers 1903, silicide films 1904, e.g., cobalt silicide films 1904, are formed, respectively.

The structure of the p-channel MOSFET region is substantially the same as that of the n-channel MOSFET region. However, the gate insulator film 1602 of the p-channel MOSFET and the gate insulator film 1601 of the n-channel MOSFET are oxynitride films having different thickness and different concentration of nitrogen. By introducing nitrogen into oxide films having different thickness at the same surface density, the gate insulator films 1601 and 1602 have different thickness and difference concentration of nitrogen. This point is a feature of the second embodiment of a semiconductor device according to the present invention. As an example, assuming that the thickness values of the base oxide films, which will form the basis for the gate insulator films of the n-channel MOSFET and p-channel MOSFET, are 1.2 nm and 1.6 nm, respectively, and assuming that nitrogen is introduced into these base oxide films at the predetermined same surface density, the concentrations of nitrogen in the oxynitride films are 14 atom % and 9 atom %, respectively.

Similar to the first embodiment, the second embodiment of a semiconductor device according to the present invention can solve problems which are conventionally difficult to be solved, as a result that the gate insulator films of the n-channel and p-channel MOSFETs have oxynitride films having different thickness values and different concentrations of nitrogen. That is, it is possible to sufficiently prevent penetration of boron in the p-channel MOSFET, and on the other hand, it is possible to obtain a sufficient current driving force while reducing the tunnel current in the n-channel MOSFET.

A method for fabricating the second embodiment of a semiconductor device according to the present invention will be described below.

FIGS. 5A through 5K are sectional views showing a sectional structure at a process of a method for fabricating the second embodiment of a semiconductor device according to the present invention, respectively.

Figure 5A:
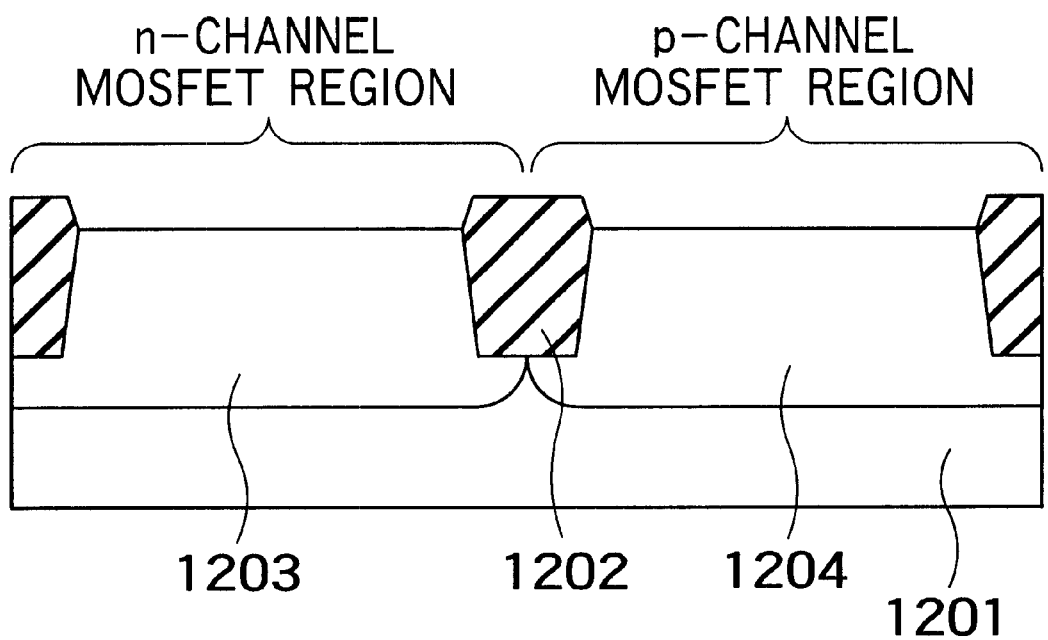
FIG. 5A is a sectional view showing an element isolating and a well forming in a method for fabricating the second embodiment of a semiconductor device according to the present invention.

First, as shown in FIG. 5A, an element isolating insulator film 1202 is formed on a silicon substrate 1201 by the STI method. Thereafter, an oxide film (not shown) is formed so as to cover element regions, and a resist (not shown) is formed thereon to ion-implant an n-type impurity into a p-channel MOSFET region and a p-type impurity into an n-channel MOSFET region to sequentially form an n-type well 1203 and a p-type well 1204. The reason why the oxide film is formed below the resist formed before ion implantation is to prevent the resist from directly contacting the surface of the silicon substrate.

Figure 5B:
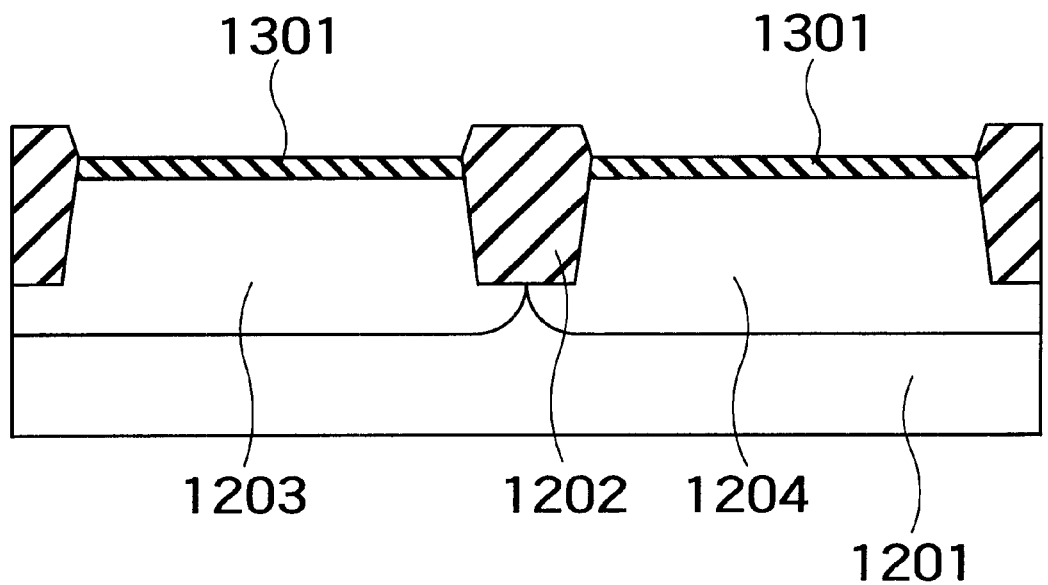
FIG. 5B is a sectional view showing a forming of a base oxide film, which will form the basis for a gate insulator film of a p-channel MOSFET, in a method for fabricating the second embodiment of a semiconductor device according to the present invention.

After forming the n-type well 1203 and the p-type well 1204, the oxide film is removed to form a gate insulator film 1301, which will form the basis for an oxynitride film being a gate insulator film, as shown in FIG. 5B. The base oxide film 1301, which will form the basis for a thicker film of the gate insulator films of the n-channel MOSFET and p-channel MOSFET, is previously formed. In this embodiment, a case where the base oxide film 1301, which will form the basis for the gate insulator film of the p-channel MOSFET, is previously formed will be described below.

Figure 5C:
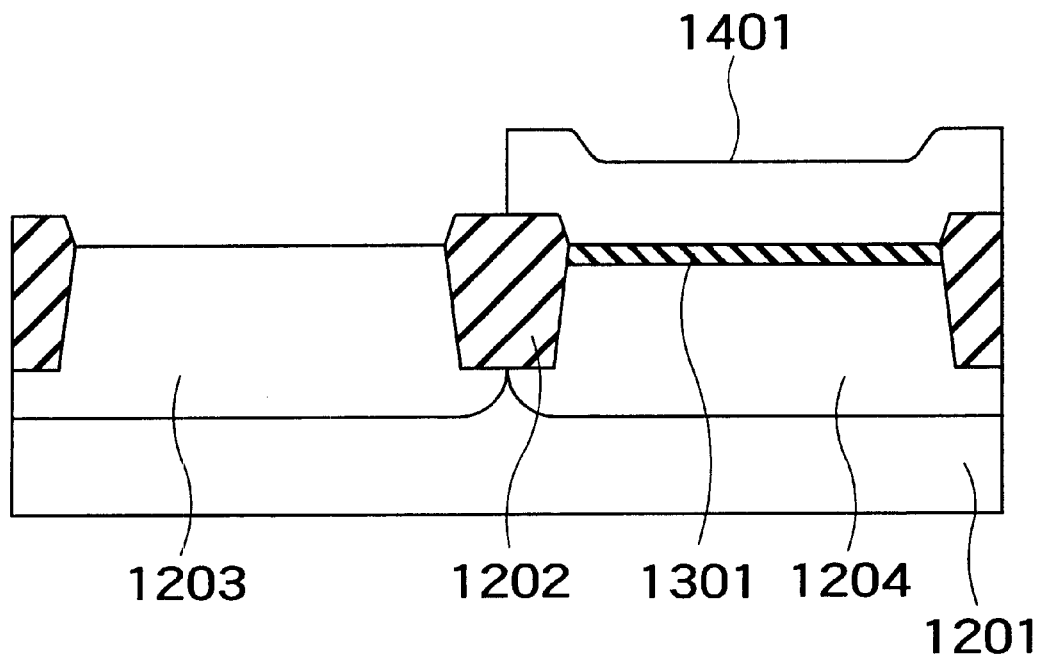
FIG. 5C is a sectional view showing an oxide film working lithography in a method for fabricating the second embodiment of a semiconductor device according to the present invention.

After forming the base oxide film 1301, a photoresist film 1401 is applied on the surface of the base oxide film 1301, and the photoresist film in the n-channel MOSFET region is removed by the lithography method, as shown in FIG. 5C. Then, the photoresist film 1401 is used as a mask for removing the oxide film 1301 from the surface of the n-type well 1203 by the wet etching. Thereafter, the photoresist film 1401 is removed.

Figure 5D:
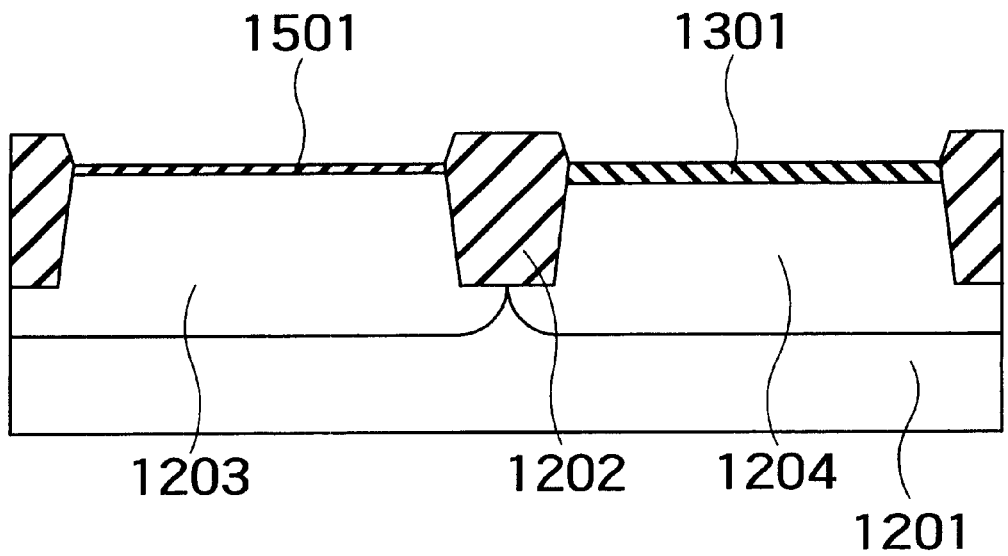
FIG. 5D is a sectional view showing an etching of an oxide film and a forming of a base oxide film, which will form the basis for a gate insulator film of an n-channel MOSFET, in a method for fabricating the second embodiment of a semiconductor device according to the present invention.

After removing the photoresist film 1401, the whole surface is oxidized again to form a base oxide film 1501, which will form the basis for a gate insulator film of the n-channel MOSFET, on the n-type well 1203 in the n-channel MOSFET region, as shown in FIG. 5D. At this time, the p-type well 1204 in the p-channel MOSFET region is hardly oxidized since it is covered with the base oxide film 1301.

At the subsequent process, nitrogen is simultaneously introduced into the base oxide films 1301 and 1501 at one process, and nitrogen is introduced at the same surface density, so that the concentrations of nitrogen in the formed oxynitride films are different substantially in inverse proportion to the thickness of each of the base oxide films. Therefore, the thickness values of the base oxide films 1301 and 1501 are set by predicting the concentration of nitrogen in each oxynitride film after introducing nitrogen. As an example, it is herein assumed that the thickness values of the base oxide films 1301 and 1501 are 1.2 nm and 1.6 nm, respectively.

Figure 5E:
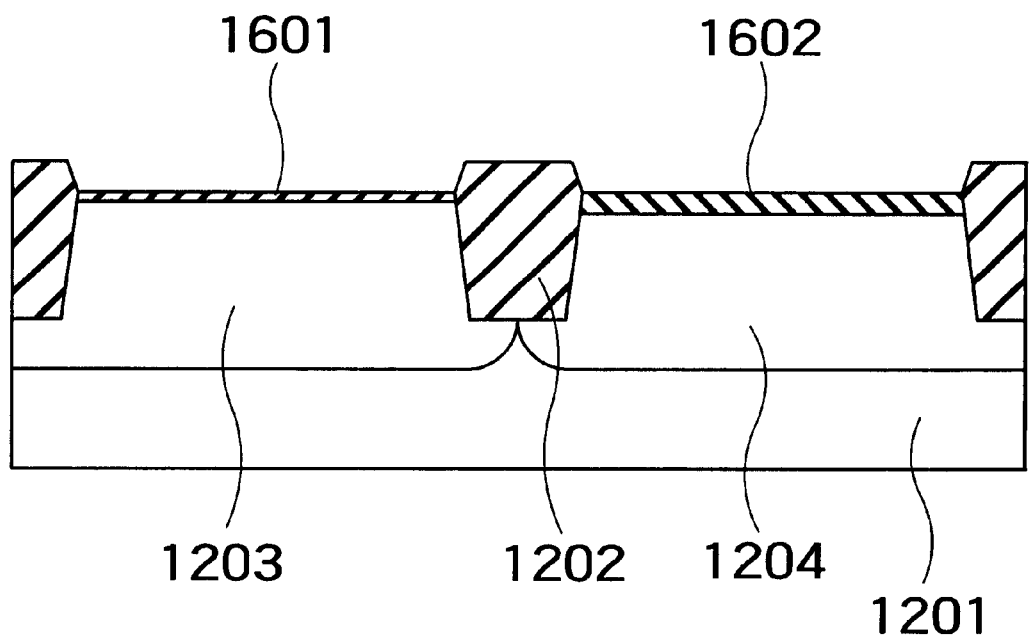
FIG. 5E is a sectional view showing an oxynitride film forming in a method for fabricating the second embodiment of a semiconductor device according to the present invention.

After forming the base oxide film 1501, nitrogen is introduced into the base oxide films 1301 and 1501 to form gate insulator films 1601 and 1602, which are oxynitride films, as shown in FIG. 5E. The nitrogen introducing method is the same as that in the first preferred embodiment. As described above, in the second embodiment, nitrogen is simultaneously introduced into the base oxide films 1301 and 1501 of the n-channel MOSFET and p-channel MOSFET at one process, so that nitrogen is introduced at the same surface density. Since the thickness values of the base oxide films 1301 and 1501 are set to be 1.2 nm and 1.6 nm, respectively, the concentrations of nitrogen in the gate insulator films 1601 and 1602 being the formed oxynitride films are substantially in inverse proportion to the thickness of each base oxide film, and are 14 atom % and 9 atom %, respectively.

Figure 5F:
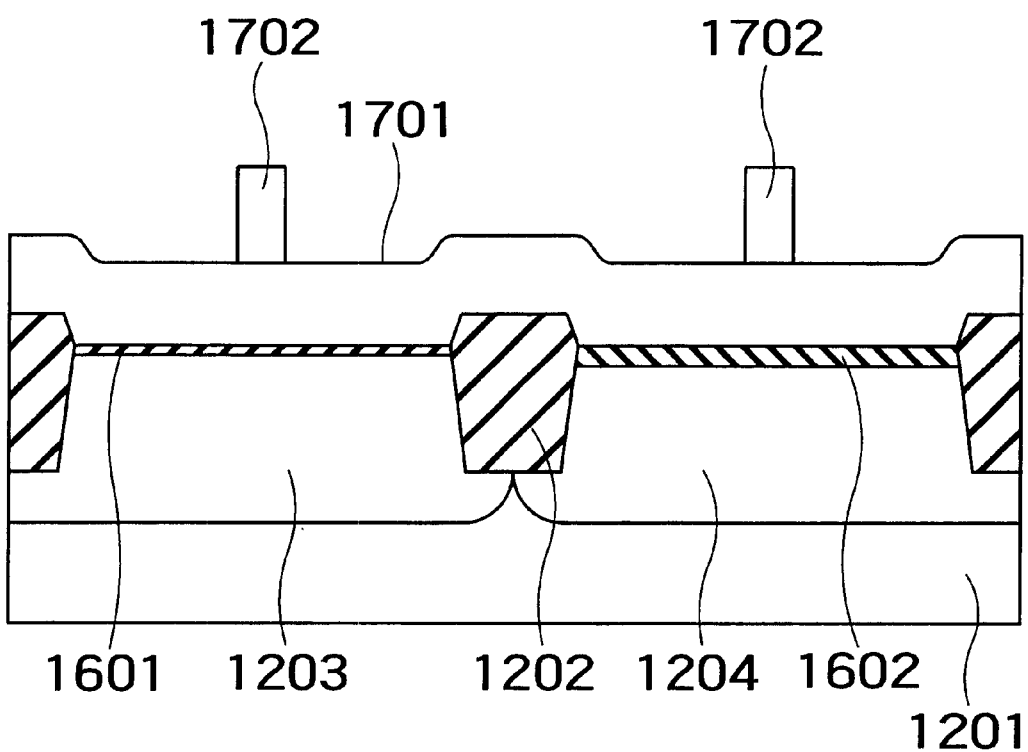
FIG. 5F is a sectional view showing a polycrystalline silicon film depositing and a gate working lithography in a method for fabricating the second embodiment of a semiconductor device according to the present invention.

After introducing nitrogen into the base oxide films 1301 and 1501 to form the gate insulator films 1601 and 1602, a polycrystalline silicon film 1701 is deposited on the whole surface as shown in FIG. 5F. Thereafter, a photoresist film 1702 is applied on the surface of the polycrystalline silicon film 1701, and the photoresist film 1702 is patterned by the lithography method so as to remain only in the gate portions of the n-channel MOSFET and p-channel MOSFET.

Figure 5G:
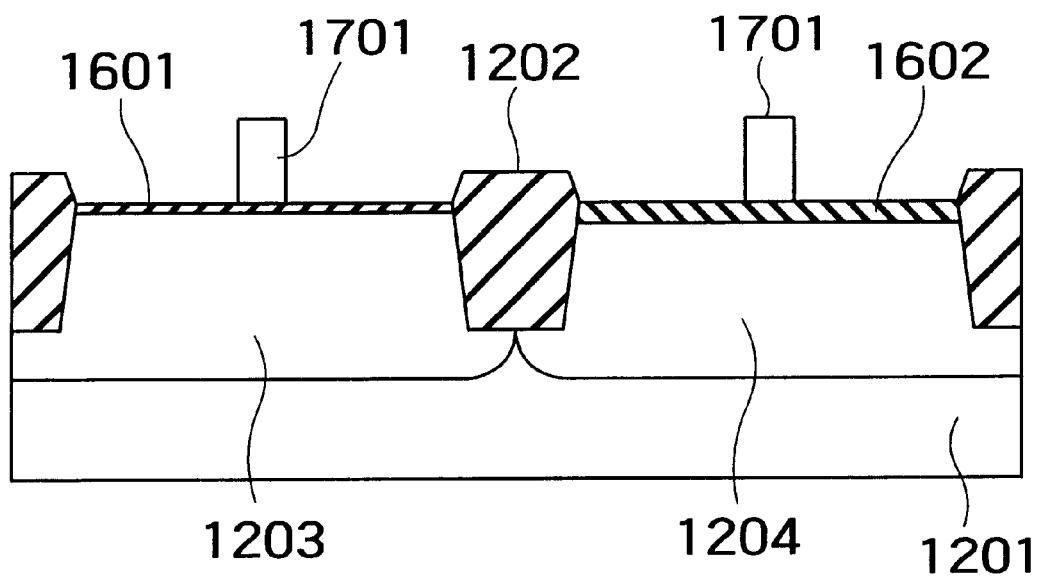
FIG. 5G is a sectional view showing a gate working in a method for fabricating the second embodiment of a semiconductor device according to the present invention.

After patterning the photoresist film 1702, the photoresist film 1702 is used as a mask for etching the polycrystalline silicon film 1701 by the RIE to form the gates 1701 of the n-channel MOSFET and p-channel MOSFET, as shown in FIG. 5G. The RIE is carried out until the oxynitride films 1601 and 1602 underlying the polycrystalline silicon film 1701 are exposed. Thereafter, the photoresist film 1702 is removed.

Figure 5H:
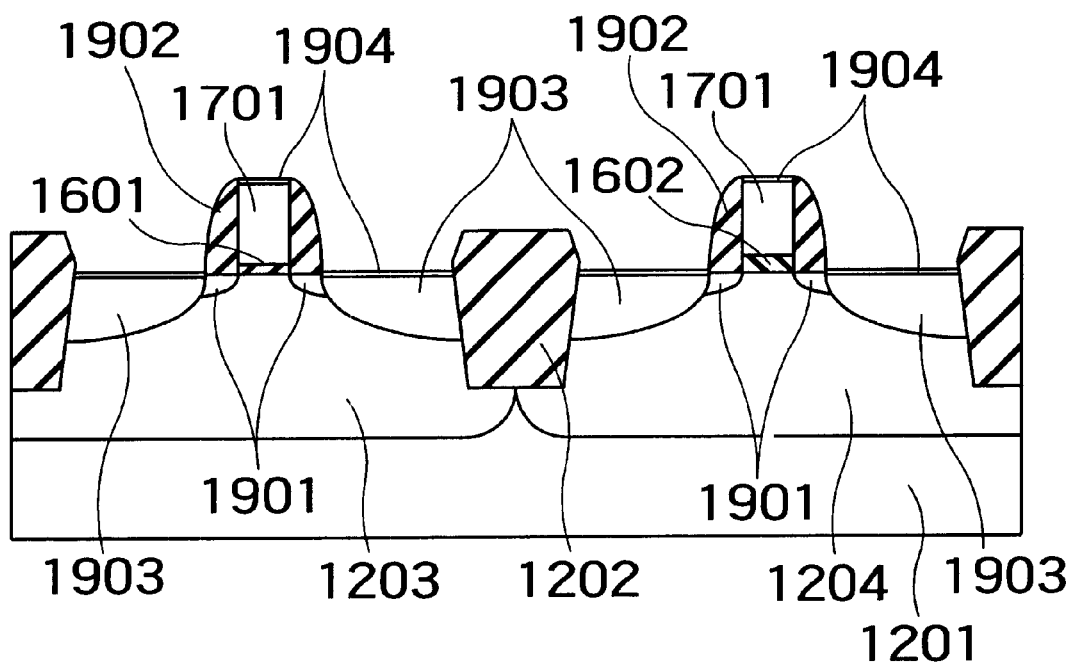
FIG. 5H is a sectional view showing a forming of a gate side wall, second and second diffusion layers, and a silicide film in a method for fabricating the second embodiment of a semiconductor device according to the present invention.

After forming the gates 1701 and removing the photoresist film 1702, first shallow diffusion layers 1901 are sequentially formed for the n-channel MOSFET and p-channel MOSFET by a conventional fabricating process as shown in FIG. 5H. Thereafter, a gate side wall insulator film is deposited and etched back by the RIE to form gate side walls 1902 shown in FIG. 5H. After forming the gate side walls 1902, the gates and side walls are used as masks for carrying out ion implantation and heat treatment to sequentially form second diffusion layers 1903, which are deeper than the first diffusion layers 1901, for the n-channel MOSFET and p-channel MOSFET. Thereafter, for example, a cobalt (Co) film is deposited by sputtering, and a heat treatment is carried out. As a result, cobalt silicide films 1904 are formed only on the gate electrode and source/drain diffusion layers. By the above described each process, a CMOSFET serving as the second embodiment of a semiconductor device according to the present invention shown in FIG. 4 is completed.

Although subsequent processes are not shown, an interlayer insulator film is deposited by a conventional technique to form a metal interconnection.

In this embodiment, it is possible to substantially obtain the same effect as that in the first embodiment although the second embodiment is different from the first embodiment at the point that nitrogen is simultaneously introduced into the base oxide films having different thickness values of the nMOSFET and pMOSFET at the same surface density, so that the gate insulator films being the oxynitride films having different thickness values and difference concentrations of nitrogen are formed. That is, it is possible to sufficiently prevent penetration of boron in the p-channel MOSFET, and it is also possible to obtain a sufficient current driving force while reducing the tunnel current.

What is claimed is:

1. A semiconductor device, comprising:
    a first MOS field effect transistor of an n-type including a first oxynitride film as a first gate insulator film; and
    a second MOS field effect transistor of a p-type including a second oxynitride film as a second gate insulator film, said second MOS field effect transistor being disposed adjacent to said first MOS field effect transistor;
    wherein a concentration of nitrogen in said first gate insulator film is different from that in said second gate insulator film and a thickness of said first gate insulator film is different from that of said second gate insulator film, said concentrations of nitrogen in said first and second gate insulator films being in a range from 5 atom % to 20 atom %, and said thicknesses of said first and second gate insulator films being in a range from 0.8 nm to 2.0 nm.

2. A semiconductor device comprising:
    a first MOS field effect transistor of an n-type including a first oxynitride film as a first gate insulator film; and
    a second MOS field effect transistor of a p-type including a second oxynitride film as a second gate insulator film, said second MOS field effect transistor being disposed adjacent to said first MOS field effect transistor;
    wherein a thickness of said second gate insulator film is thicker than that of said first gate insulator film and a concentration of nitrogen in said second gate insulator film is higher than that in said first gate insulator film as a result of introduction of different concentrations of nitrogen into oxide films having had the same thickness, said thicknesses of said first and second gate insulator films being in a range from 0.8 nm to 2.0 nm, said concentrations of nitrogen in said first and second gate insulator films being in a range from 5 atom % to 20 atom %.

3. The semiconductor device as set forth in claim 2, wherein an element isolating insulator film to isolate said first and second MOS field effect transistor regions from each other is an element isolating insulator film having an STI (Shallow Trench Isolation) structure.

4. A semiconductor device comprising:
    a first MOS field effect transistor of an n-type including a first oxynitride film as a first gate insulator film; and
    a second MOS field effect transistor of a p-type including a second oxynitride film as a second gate insulator film, said second MOS field effect transistor being disposed adjacent to said first MOS field effect transistor;
    wherein a thickness of said second gate insulator film is thicker than that of said first gate insulator film and a concentration of nitrogen in said second gate insulator film is higher than that in said first gate insulator film as a result of introduction of nitrogen at the same surface density into oxide films having had different thickness values, said thicknesses of said first and second gate insulator films being in a range from 0.8 nm to 2.0 nm, said concentrations of nitrogen in said first and second gate insulator films being in a range from 5 atom % to 20 atom %.

5. The semiconductor device as set forth in claim 4, wherein an element isolating insulator film to isolate said first and second MOS field effect transistor regions from each other is an element isolating insulator film having an STI structure.

* * * * *